(12) United States Patent
Lu et al.

(10) Patent No.: US 9,698,373 B2
(45) Date of Patent: Jul. 4, 2017

(54) PHOTOELECTRIC DEVICE COMPRISING THE BARRIER FILM LAYER

(71) Applicant: BOE Technology Group Co., Ltd., Beijing (CN)

(72) Inventors: Yongchun Lu, Beijing (CN); Yong Qiao, Beijing (CN); Hongfei Cheng, Beijing (CN); Jianbo Xian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/773,486

(22) PCT Filed: Dec. 12, 2014

(86) PCT No.: PCT/CN2014/093733
§ 371 (c)(1),
(2) Date: Sep. 8, 2015

(87) PCT Pub. No.: WO2016/019674
PCT Pub. Date: Feb. 11, 2016

(65) Prior Publication Data
US 2016/0204376 A1    Jul. 14, 2016

(30) Foreign Application Priority Data

Aug. 5, 2014  (CN) .......................... 2014 1 0381466

(51) Int. Cl.
*H01L 49/02* (2006.01)
*H01L 51/52* (2006.01)
(Continued)

(52) U.S. Cl.
CPC .......... *H01L 51/5253* (2013.01); *H01L 31/02* (2013.01); *H01L 31/18* (2013.01);
(Continued)

(58) Field of Classification Search
CPC ..... H01L 31/10; H01L 31/102; H01L 31/143; H01L 31/145; H01L 31/147; H01L 27/15; H01L 28/57; H01L 28/75; H01L 51/5253
See application file for complete search history.

(56) References Cited

U.S. PATENT DOCUMENTS 8,629,427 B2    1/2014  Banerjee et al.
2012/0273763 A1*  11/2012  Banerjee ............... H01L 49/003
                                                                  257/39

FOREIGN PATENT DOCUMENTS

CN      1957485 A      5/2007
CN    102751442 A     10/2012
(Continued)

OTHER PUBLICATIONS

Apr. 28, 2015—International Search Report and Written Opinion Appn PCT/CN2014/093733 with English Tran.
(Continued)

*Primary Examiner* — Hoai V Pham
(74) *Attorney, Agent, or Firm* — Banner & Witcoff, Ltd.

(57) ABSTRACT

A barrier film layer, a photoelectric device comprising the barrier film layer and a manufacturing method of the photoelectric device are provided. A material forming the barrier film layer includes a topological insulator, and the barrier film layer is formed on a surface of an base plate which is patterned. In this way, a better package of the photoelectric device can be achieved.

10 Claims, 1 Drawing Sheet

(51) Int. Cl.
    *H01L 31/02*     (2006.01)
    *H01L 51/56*     (2006.01)
    *H01L 31/18*     (2006.01)

(52) U.S. Cl.
    CPC ............. *H01L 51/52* (2013.01); *H01L 51/56* (2013.01); *Y02P 70/521* (2015.11)

(56) References Cited

FOREIGN PATENT DOCUMENTS

| CN | 102832356 A | 12/2012 |
|----|-------------|---------|
| CN | 103413594 A | 11/2013 |
| CN | 103456892 A | 12/2013 |
| CN | 104157705 A | 11/2014 |

OTHER PUBLICATIONS

Jan. 22, 2016—(CN)—First Office Action Appn 201410381466.0 with English Tran.

May 25, 2016—(CN)—Second Office Action Appn 201410381466.0 with English Tran.

Lada V. Yashina, et al., "Negligible Surface Reactivity of Topological Insulators Bi2Se3 and Bi2Te3 Towards Oxygen and Water", American Chemical Society, vol. 7, No. 6, pp. 4181-5191, May 16, 2013.

Jul. 14, 2016—(CN)—Third Office Action Appn 201410381466.0 with English Tran.

Apr. 14, 2017—(CN)—Office Action Appn 201410381466.0 with English Translation.

Xu, Yong, et al., Large-Gap Quantum Spin Hall Insulators in Tin Films, Physical Review Letters, Received Jun. 7, 2013; published Sep. 24, 2013, cited in CN office action dated Apr. 14, 2017.

* cited by examiner

PHOTOELECTRIC DEVICE COMPRISING THE BARRIER FILM LAYER

The application is a U.S. National Phase Entry of International Application No. PCT/CN2014/093733 filed on Dec. 12, 2014, designating the United States of America and claiming priority to Chinese Patent Application No. 201410381466.0 filed on Aug. 5, 2014. The present application claims priority to and the benefit of the above-identified applications and the above-identified applications are incorporated by reference herein in their entirety.

TECHNICAL FILED

Embodiments of the present invention relate to a barrier film layer, a photoelectric device comprising the barrier film layer, and a manufacturing method of the photoelectric device.

BACKGROUND

Photoelectric devices generally refer to photoconductive devices operating by utilizing the photosensitivity of semiconductors or photocells and semiconductor light-emitting devices operating by utilizing the photovoltaic effect of semiconductors. Photoelectric devices such as light guide, photocell, light-emitting diode, phototransistor and thermistor are widely applied in various technical fields.

Most of photoelectric devices have to utilize a barrier film layer to protect against air or water vapor so as to increase the service life of devices.

Hereinafter organic light-emitting display devices are described by way of example. Organic light-emitting materials are applicable in the field of display to manufacture organic light-emitting displays. A decrease in the service life of the organic light-emitting display device is mainly attributed to three factors including: first of all, electrodes in the organic light-emitting device mostly are formed of a metal material such as Al, Mg and Ca which are usually active and thus liable to be corroded in the air or in other atmosphere containing oxygen; secondly, hydroxy compounds generated by an oxidation action between oxygen and a light-emitting layer act as an effective quenching agent which can considerably decrease the luminescence quantum efficiency of the organic light-emitting display device; moreover, the heat produced during the operation of organic light-emitting device can further aggravate the degradation of light-emitting materials, electrode materials and the like of devices in the air.

Therefore, organic light-emitting devices are usually packaged by forming barrier film layers utilizing materials such as silicon nitride to protect against air and water vapor, which can greatly increase the service life of devices.

SUMMARY

Embodiments of the present invention provide a barrier film layer, a photoelectric device comprising the barrier film layer and a manufacturing method of the photoelectric device, which can achieve excellent package of photoelectric devices.

At least one embodiment of the present invention provides a barrier film layer, wherein a material forming the barrier film layer comprises a topological insulator, and the barrier film layer is formed on a surface of a base plate which is patterned.

Another embodiment of the present invention provides a photoelectric device comprising: a substrate; a functional layer formed on a first surface of the substrate; and at least one barrier film layer formed on the first surface of the substrate. The barrier film layer is the barrier film layer provided by any one of the embodiments of the present invention.

Yet another embodiment of the present invention provides a manufacturing method of a photoelectric device comprising: forming a barrier film pattern by using a topological insulator; and forming a multi-layered structure on a first surface of a substrate, wherein the multi-layered structure comprises a functional layer and a barrier film layer formed by the barrier film pattern.

BRIEF DESCRIPTION OF THE DRAWINGS

In order to explain the technical solution of embodiments of the present invention more clearly, accompanying drawings of the embodiments will be introduced briefly below. Obviously, the accompanying drawings in the following description only relate to some embodiments of the present invention and thus are not limitative of the present invention.

DETAILED DESCRIPTION

Figure 1:
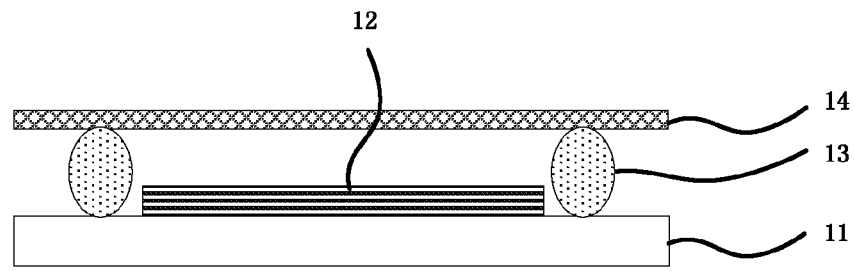
FIG. 1 is a schematic diagram illustrating a photoelectric device provided by an embodiment of the present invention.

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

The inventor has noticed that existing barrier film layers can only produce modest effect when used for packaging photoelectric devices.

At least one embodiment of the present invention provides a barrier film layer, wherein a material forming the barrier film layer comprises a topological insulator, and the barrier film layer is formed on a surface of a base plate which is patterned.

The material forming the barrier film layer comprises a topological insulator, that is, the barrier film layer can be formed of the topological insulator only or can be formed of a mixed material of the topological insulator and a polymer or the like. Embodiments of the present invention will be described in details with the barrier film layer formed of the topological insulator only, by way of example.

The topological insulator is a physical form of substance newly discovered in recent years. The topological insulator has an energy band structure which is identical with a common insulator in that they both have a limited energy gap at Fermi energy level, and is distinguished from the common insulator in that its boundary or surface being in a Dirac-typed, spinning, non-degenerate, electrically conductive edge state with no energy gap as an unique property thereof. An existence of such electrically conductive edge state is stable such that information can be transferred by spinning electrons rather than by charges of conventional materials. Thus the topological insulator has a better conductivity without dissipation of heat; that is, generating no heat. Furthermore, the barrier film layer formed of the topological insulator has not only better effect of protecting against water vapor and oxygen but also functions of heat dissipation and anti-electrostatic because of the topological property of the topological insulator.

The barrier film layer is formed on a surface of a base plate which is patterned; that is, during formation of the barrier film layer provided by the embodiment of the present invention, the base plate is firstly patterned by etching to form the surface of the base plate having a barrier film pattern; then forming a barrier film layer of topological insulator on the surface of the base plate.

In the barrier film layer formed of topological insulator provided by the embodiment of the present invention, the barrier film layer can not only excellently protect against water vapor and oxygen, but also facilitate heat dissipation of other devices and provide effect of anti-electrostatic for other devices.

For example, in an embodiment of the present invention, the barrier film layer is a topological insulator with a two-dimensional nanostructure. The topological insulator with a two-dimensional nanostructure is a film formed of topological insulator and having a thickness at nanoscale, which can be, for example, a two-dimensional nanofilm, a two-dimensional nanosheet or a two-dimensional nanostrip, etc., which is formed of topological insulator. The topological insulator with a two-dimensional nanostructure has a super-high specific surface area and also a controllable energy band structure, and hence can considerably decrease a ratio of bulk carriers and represent a topological surface state, thereby achieving better conductivity.

For example, the two-dimensional nanostructure can also be a two-dimensional strip shaped nanostructure or a two-dimensional rhombic nanostructure. Of course, the two-dimensional nanostructure can also be a two-dimensional network nanostructure including a plurality of openings arranged in an array. For example, the opening can have a shape of rhombus, square or hexagon, etc.

It should be explained that the topological insulator with a two-dimensional nanostructure is more applicable for display devices attributed to both of its relatively higher flexibility and transmittance similar to the graphene structure.

For example, the topological insulator comprises at least one selected from the group consisting of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, a tin single layer and a modified tin single layer.

For example, $Ge_1Bi_4Te_7$, $Ge_2Bi_2Te_5$ and $Ge_1Bi_2Te_4$ are all chalcogenide. AmN and PuTe are topological insulators having strong interaction. Of course, the topological insulator can also be other materials such as ternary Hessler compounds.

The topological insulator comprises at least one selected from the group consisting of HgTe, $Bi_xSb_{1-x}$, $Sb_2Te_3$, $Bi_2Te_3$, $Bi_2Se_3$, $T_1BiTe_2$, $T_1BiSe_2$, $Ge_1Bi_4Te_7$, $Ge_2Bi_2Te_5$, $Ge_1Bi_2Te_4$, AmN, PuTe, a tin single layer and a modified tin single layer, which means that the topological insulator can be, for example, HgTe or $Bi_xSb_{1-x}$ or $Sb_2Te_3$ or $Bi_2Te_3$ or $Bi_2Se_3$ or $T_1BiTe_2$ or $T_1BiSe_2$ or $Ge_1Bi_4Te_7$ or $Ge_2Bi_2Te_5$ or $Ge_1Bi_2Te_4$ or AmN or PuTe or a tin single layer or a modified tin single layer. Alternatively, the topological insulator can also be a mixed material formed of more than one material listed above, for example, a mixed material formed of two of the above-listed materials. Of course, the topological insulator can also be a mixed material formed of three of the above-listed materials, and so on. In case where the topological insulator is a mixed material formed of at least two of the above-listed materials, the materials can be selected to have complementary properties so as to increase the property of the mixed material.

For example, the topological insulator is a tin single layer or a modified tin single layer.

A tin single layer is a kind of two-dimensional material having a thickness of only one tin atom. A tin single layer has a better light-transmittance for its thickness at atom layer level; and also a better flexibility and high transmittance, similar to graphene.

A tin single layer has a conductivity reaching 100% under normal temperature, which makes it a superconducting material.

A modified tin single layer is formed by surface-modifying or magnetic-doping a tin single layer. For example, surface-modifying a tin single layer can comprise: adding a functional group such as —F, —Cl, —Br, —I and —OH to a tin single layer, so as to achieve modification of the tin single layer.

For example, a modified tin single layer is tin fluoride formed by surface-modifying a tin single layer with fluorine atoms. In case where F atoms are added to the atom structure of the tin single layer, a conductivity of the tin single layer can also reach 100% under a temperature up to 100° C., with still stable property.

An embodiment of the present invention provides a photoelectric device comprising a substrate; a functional layer formed on a first surface of the substrate; and at least one barrier film layer formed on the first surface of the substrate. The barrier film layer is the barrier film layer provided by any one of embodiments of the present invention.

It should be explained that, for example, the photoelectric device can be organic light-emitting device or can be transistor and the like. Correspondingly, in case where the photoelectric device is an organic light-emitting device, the functional layer can be an organic light-emitting functional layer, comprising a hole transport functional layer (HTL), a hole injection functional layer (HIL), a light-emitting functional layer (EML), an electron injection functional layer (EIL), an electron transport functional layer (ETL) and the like; in case where the photoelectric device is a transistor, the functional layer comprises a grid, an insulating layer, an active layer, a source and a drain. Of course, the photoelectric device can be other devices, with the corresponding functional layer being different from those described above. Embodiments of the present invention are merely described in details with the organic light-emitting diode used as the photoelectric device, by way of example.

In an example of the present invention, the photoelectric device comprises a functional layer formed on the first surface of the substrate and at least one barrier film layer; for example, it can form the functional layer and two layers of barrier film layer on the first surface of the substrate, and a locational relationship between the two layers of barrier film layer and the functional layer can be configured according to actual demands.

The terms "above" and "beneath" used in the embodiments of the present invention should be interpreted according to a relative sequence of forming the films or patterns. For example, a film or pattern located above refers to the film or pattern formed later with respect to a reference, while a film or pattern located beneath refers to the film or pattern formed earlier with respect to a reference.

For example, the barrier film layer can be adhered onto the substrate through an adhering layer. For example, the adhering layer can be formed of substances with adhesion property such as double faced adhesive tape and glue.

For example, as illustrated in FIG. 1, the photoelectric device comprises a substrate 11; a functional layer 12 formed on a first surface of the substrate; and a first barrier film layer 14 formed above the functional layer 12.

For example, as illustrated in FIG. 1, the first barrier film layer 14 is not contacted with the functional layer 12, and the first barrier film layer 14 is not electrically connected with the functional layer 12.

For example, in order to prevent the first barrier film layer 14 from being contacted with or electrically connected to the functional layer 12, an insulating layer can be formed between the first barrier film layer 14 that is formed above the functional layer 12 and the functional layer 12, and the first barrier film layer 14 is located above the insulating layer. Alternatively or additionally, as illustrated in FIG. 1, sealing glue 13 is formed between the first barrier film layer 14 and the substrate 11, and the first barrier film layer 14 is located above the sealing glue 13. The embodiments of the present invention are merely described in details with those illustrated in the drawings, by way of example.

Figure 2:
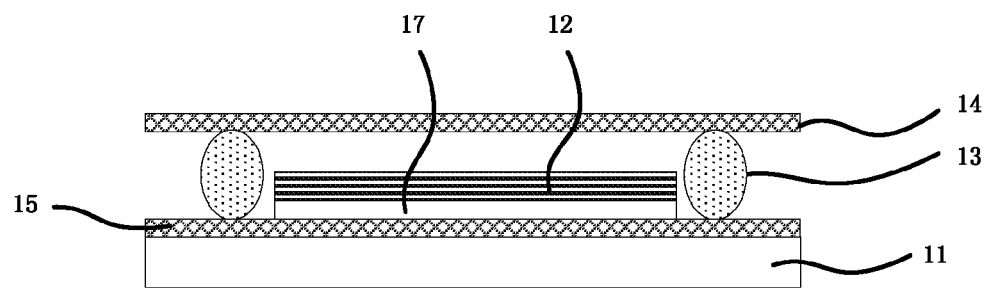
FIG. 2 is a schematic diagram illustrating another photoelectric device provided by an embodiment of the present invention.

For example, as illustrated in FIG. 2, the photoelectric device comprises a substrate 11; a functional layer 12 formed on a first surface of the substrate; a first barrier film layer 14 formed above the functional layer 12; and a second barrier film layer 15 formed between the functional layer 12 and the substrate 11. As illustrated in FIG. 2, the photoelectric device can further comprise an insulating layer 17 formed between the functional layer 12 and the second barrier film layer 15. Since the second barrier film layer 15 is located between the functional layer 12 and the substrate 11, in case where a surface of the functional layer 12 that is contacted with the second barrier film layer 15 is formed of conductive materials, it is required to additionally form an insulating layer 17 between the functional layer 12 and the second barrier film layer 15. In case where the surface of the functional layer 12 that is contacted with the second barrier film layer 15 is formed of insulating materials, it's not necessary to additionally arrange an insulating layer.

Figure 3:
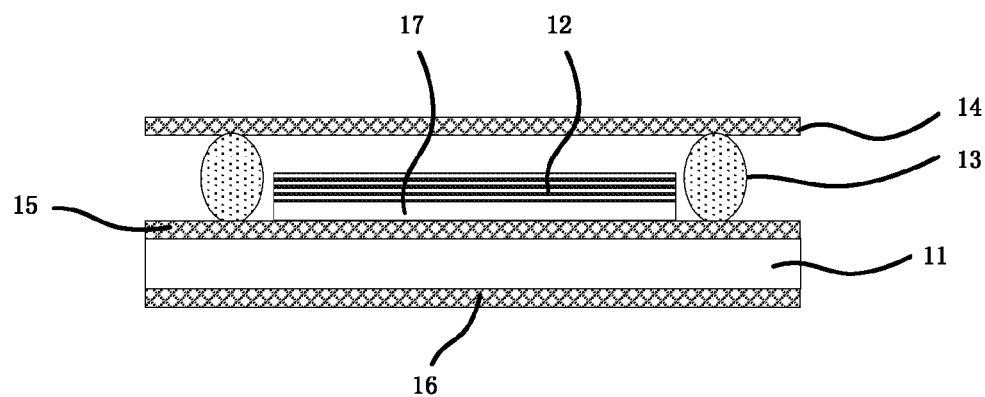
FIG. 3 is a schematic diagram illustrating yet another photoelectric device provided by an embodiment of the present invention.

For example, as illustrated in FIG. 3, the photoelectric device comprises a substrate 11; a functional layer 12 formed on a first surface of the substrate; a first barrier film layer 14 formed above the functional layer 12; a second barrier film layer 15 formed between the functional layer 12 and the substrate 11; and a third barrier film layer 16 formed on a second surface of the substrate 11 opposite to the first surface. The third barrier film layer 16 further facilitates protecting against water vapor and providing effect of anti-electrostatic.

For example, as illustrated in FIGS. 1-3, sealing glue 13 containing a topological insulator can be further formed between the barrier film layer and the substrate. The sealing glue is configured to achieve sealing between two substrates to be assembled during a cell-assembling process. The sealing glue comprises a topological insulator, thus possesses topological property, and hence can be applied in the device to protect against water vapor and dissipate heat, thereby improving device performance.

Another embodiment of the present invention provides a manufacturing method of photoelectric device, comprising steps as below.

Step 101, forming a barrier film pattern by utilizing a topological insulator.

The barrier film pattern can be a first barrier film pattern, and can also be a second barrier film pattern or a third barrier film pattern or the like, which patterns are different from each other but substantially identical in their manufacturing methods.

For example, the above step 101 comprises steps as below.

Step 1011, patterning a base plate by etching to form a pattern corresponding to a barrier film layer.

For example, the base plate can be mica, or can be $SrTiO_3(111)$, or can be other base plates on which a film of topological insulator can be grown by Molecular Beam Epitaxy (MBE). The embodiment of the present invention is described in details with the mica as the base plate by way of example.

Step 1012, forming a film of topological insulator on a surface of the base plate which is patterned.

For example, growing a film of $Bi_2Se_3$ on a patterned surface of the base plate of mica by Molecular Beam Epitaxy (MBE). Of course, films of other topological insulators can also be grown. Embodiments of the present invention are described in details with $Bi_2Se_3$ as the topological insulator, by way of example.

Step 1013, removing the base plate to obtain a barrier film pattern.

For example, dissolving the base plate of mica to obtain the barrier film pattern of topological insulator.

Step 102, forming a multi-layered structure on a first surface of a substrate, wherein the multi-layered structure comprises a functional layer and a barrier film layer formed by the barrier film pattern.

The multi-layered structure is varying depending on the type and specific structure of the device.

The above step 102 comprises steps as below.

Step 1021, forming a functional layer on a first surface of a substrate.

For example, a hole transport functional layer (HTL), a hole injection functional layer (HIL), a light-emitting functional layer (EML), an electron injection functional layer (EIL), an electron transport functional layer (ETL) and the like are formed on the first surface of the substrate by processes such as depositing and patterning, so as to form an organic light-emitting device.

Step 1022, forming a first barrier film layer above the functional layer.

For example, forming a first barrier film layer above the functional layer can comprise: forming an adhesion layer on a surface of the barrier film pattern; and adhering the barrier film pattern onto a corresponding area of the functional layer through the adhesion layer.

Alternatively, the above step 102 comprises steps as below.

Step 1023, forming a second barrier film layer on a first surface of the substrate.

For example, step 2013 can comprise: forming an adhesion layer on a surface of a second barrier film pattern; and adhering the second barrier film pattern onto a corresponding area of the substrate through the adhesion layer.

Step 1021', forming a functional layer on the second barrier film layer.

For example, a hole transport functional layer (HTL), a hole injection functional layer (HIL), a light-emitting functional layer (EML), an electron injection functional layer (EIL), an electron transport functional layer (ETL) and the like are formed on the second barrier film layer by processes such as depositing and patterning, so as to form an organic light-emitting device.

Step 1022', forming a first barrier film layer above the functional layer.

For example, forming a first barrier film layer above the functional layer can comprise: forming an adhesion layer on a surface of the barrier film pattern; and adhering the barrier film pattern onto a corresponding area of the functional layer through the adhesion layer.

For example, the manufacturing method comprises steps as below.

Step 101, forming a barrier film pattern by utilizing a topological insulator.

Step 102, forming a multi-layered structure on a first surface of a substrate, wherein the multi-layered structure comprises a functional layer and a barrier film layer formed by the barrier film pattern.

Step 103, forming a third barrier film layer on a second surface of the substrate opposite to the first surface.

With the above method comprising steps 101, 102 and 103, the photoelectric device as illustrated in FIG. 3 is obtained. The third barrier film layer 16 further facilitates protecting against water vapor and providing effect of anti-electrostatic.

For example, another embodiment of the present invention provides another manufacturing method of photoelectric device, wherein the manufacturing method further comprises forming sealing glue between the barrier film layer and the substrate, wherein the sealing glue contains a topological insulator.

Hereinafter a specific example is illustrated to explain the manufacturing method of photoelectric device as provided by the embodiment of the present invention, wherein the method comprises steps as below.

Step 201, forming a first barrier film pattern, a second barrier film pattern and a third barrier film pattern by utilizing a topological insulator.

For the implementation of step 201, reference can be made to the above-mentioned step 101.

Step 202, forming a second barrier film layer on a first surface of a substrate.

For the implementation of step 202, reference can be made to the above-mentioned step 1023.

Step 203, forming a functional layer on the second barrier film layer.

For example, a hole transport functional layer (HTL), a hole injection functional layer (HIL), a light-emitting functional layer (EML), an electron injection functional layer (EIL), an electron transport functional layer (ETL) and the like are formed on the second barrier film layer by processes such as depositing and patterning, so as to form an organic light-emitting device.

Step 204, forming sealing glue on the substrate.

For example, the sealing glue contains a topological insulator.

Step 205, forming a first barrier film layer above the functional layer.

For example, forming a first barrier film layer above the functional layer can comprise: forming an adhesion layer on a surface of the barrier film pattern; and adhering the barrier film pattern onto a corresponding area of the functional layer through the adhesion layer.

Step 206, forming a third barrier film layer on a second surface of the substrate opposite to the first surface.

For the implementation of step 206, reference can be made to the above-mentioned step 103.

Of course, the steps forming the photoelectric device are not limited to those described above, for example, the above-mentioned step 204 and step 205 can be adjusted depending on the type of the photoelectric device. The embodiments above are merely described by way of example.

Embodiments of the present invention provide a barrier film layer, a photoelectric device comprising the barrier film layer and a manufacturing method of the photoelectric device, in which the material forming the barrier film layer comprises a topological insulator, so that the barrier film layer can not only excellently protect against water vapor and oxygen but also facilitate dissipating the heat and providing effect of anti-electrostatic for other devices.

The above implementations only serve to explain the present invention rather than limit the present invention. Those of ordinary skill in the art can make various modifications and variations without departing from the spirit and scope of the present invention. Therefore all equivalent technical proposals belong to the scope of the present invention and the scope of patent protection of the present invention should be defined by the claims.

The present application claims the priority of China patent application No. 201410381466.0 filed on Aug. 5, 2014, which is incorporated in its entirety herein by reference as part of the present application.

What is claimed is:

1. A photoelectric device comprising:
a substrate;
a functional layer formed on a first surface of the substrate; and
at least one barrier film layer formed on the first surface of the substrate, and not electrically contacting the functional layer,
wherein the at least one barrier film layer comprises a topological insulator; and a sealing glue is formed between the barrier film layer and the substrate, and the sealing glue contains a topological insulator.

2. The photoelectric device of claim 1, wherein the barrier film layer is a topological insulator with a two-dimensional nanostructure.

3. The photoelectric device of claim 1, wherein the topological insulator comprises at least one selected from the group consisting of HgTe, $Bi_xSb_{1-x}$, $Sb_2Te_3$, $Bi_2Te_3$, $Bi_2Se_3$, $TlBiTe_2$, $TlBiSe_2$, $Ge_1Bi_4Te_7$, $Ge_2Bi_2Te_5$, $Ge_1Bi_2Te_4$, AmN, PuTe, a tin single layer and a modified tin single layer.

4. The photoelectric device of claim 3, wherein the modified tin single layer is formed by surface-modifying or magnetic-doping the tin single layer.

5. The photoelectric device of claim 4, wherein the modified tin single layer is a tin fluoride formed by surface-modifying the tin single layer with fluorine atoms.

6. The photoelectric device of claim 1, wherein the at least one barrier film layer comprises a first barrier film layer formed above the functional layer.

7. The photoelectric device of claim 6, wherein the at least one barrier film layer comprises a second barrier film layer formed between the functional layer and the substrate.

8. The photoelectric device of claim 7, wherein a third barrier film layer is further formed on a second surface of the substrate opposite to the first surface.

9. The photoelectric device of claim 8, wherein the barrier film layer is adhered onto the substrate through an adhesion layer.

10. The photoelectric device of claim 1, wherein the barrier film layer is adhered onto the substrate through an adhesion layer.

\* \* \* \* \*